(12) United States Patent
Geynet et al.

(10) Patent No.: US 7,250,824 B2
(45) Date of Patent: Jul. 31, 2007

(54) VOLTAGE CONTROLLED OSCILLATOR WITH LINEAR CAPACITANCE

(75) Inventors: Lionel Geynet, Fontanes (FR); Emeric De Foucauld, Seyssinet (FR)

(73) Assignee: Commissariat A L'Energie Atomique, Paris (FR)

( * ) Notice: Subject to any disclaimer, the term of this patent is extended or adjusted under 35 U.S.C. 154(b) by 11 days.

(21) Appl. No.: 11/152,075

(22) Filed: Jun. 15, 2005

(65) Prior Publication Data

US 2006/0017513 A1 Jan. 26, 2006

(30) Foreign Application Priority Data

Jul. 22, 2004 (FR) ................... 04 08121

(51) Int. Cl.
*H03B 5/12* (2006.01)
(52) U.S. Cl. ............... 331/36 C; 331/177 V; 331/167
(58) Field of Classification Search ........... 331/177 V, 331/36 C, 117 FE, 167
See application file for complete search history.

(56) References Cited

U.S. PATENT DOCUMENTS

| 5,493,715 | A | * | 2/1996 | Humphreys et al. | ........ 455/264 |
|---|---|---|---|---|---|
| 5,900,788 | A | * | 5/1999 | Hagemeyer | ............. 331/117 R |
| 6,075,421 | A | * | 6/2000 | Chong | .................... 331/117 R |
| 6,292,065 | B1 | | 9/2001 | Friedman et al. | |
| 6,396,356 | B1 | | 5/2002 | Mehta et al. | |
| 6,580,331 | B2 | * | 6/2003 | Ikarashi | .................. 331/117 D |
| 6,657,509 | B1 | | 12/2003 | Ohannes | |
| 7,064,622 | B2 | * | 6/2006 | Jasa et al. | ............... 331/117 R |

* cited by examiner

*Primary Examiner*—Robert Pascal
*Assistant Examiner*—Levi Gannon
(74) *Attorney, Agent, or Firm*—Oliff & Berridge, PLC

(57) ABSTRACT

The voltage controlled oscillator comprises an amplifier and an oscillating system comprising an inductor and a first and second variable capacitor connected in series, each having a capacitance varying according to its control voltage. The capacitance of one of the variable capacitors varies in the same direction as its control voltage and the capacitance of the other variable capacitor varies in the opposite direction to its control voltage. A capacitor having a fixed capacitance can be connected in series or in parallel with the first and second variable capacitors. The first and second variable capacitors are preferably formed by transistors, respectively of PMOS and NMOS type. An additional series of additional first and second variable capacitors can be connected in parallel with the first and second variable capacitors.

9 Claims, 4 Drawing Sheets

VOLTAGE CONTROLLED OSCILLATOR WITH LINEAR CAPACITANCE

BACKGROUND OF THE INVENTION

The invention relates to a voltage controlled oscillator comprising an amplifier and an oscillating system comprising an inductor and at least first and second variable capacitors each having a capacitance varying according to its control voltage.

STATE OF THE ART

A voltage controlled oscillator (VCO) supplies oscillating signals the frequency of which varies according to a control voltage Uc. The gain of the voltage controlled oscillator is defined by the ratio K=F/Uc between the frequency F of its output signals and the control voltage Uc applied to its input. The gain generally varies according to the control voltage Uc applied.

Voltage controlled oscillators are often used in phase lock loops, as represented in FIG. 1. Such a loop conventionally comprises a voltage controlled oscillator 1, the input whereof is connected, by means of a filter 2, to the output of a phase comparator 3, the output whereof, which forms the output of the loop, is connected to a first input of the phase comparator 3, possibly by means of a frequency divider 4. Clock signals, having a predetermined reference frequency Fref and for example supplied by a quartz oscillator, are applied to a second input of the phase comparator 3.

The control voltage Uc of the oscillator is thus a function of the difference between the frequency Fs of the output signals of the oscillator 1, whereto a dividing coefficient may be assigned, and of the reference frequency Fref. When the loop is locked, the output frequency Fs is thus equal to the reference frequency Fref or to a multiple thereof.

Such a phase lock loop is used in a large number of circuits requiring frequency synthesis, in particular in the radiofrequency field, for modulated signal receipt. Several transmission standards, for example GSM, GPS or DCS type standards, standards using the Bluetooth technology or a wireless local area system (WLAN), are often used in the same receiver, in particular in portable telephones. It is then desirable to be able to switch quickly from one standard to another, for example from a GSM type standard to a Bluetooth type standard.

Switching from one standard to the other, i.e. from one frequency band to another, can cause pulling out of synchronism of the phase lock loop, i.e. the voltage controlled oscillator no longer supplies any signal. To avoid pulling out of synchronism of the loop, it is sought to build oscillators 1 the variations of frequency F whereof with the control voltage Uc are linear and monotonic, i.e. the gain K=F/Uc whereof is a constant.

A voltage controlled oscillator typically comprises an amplifier and an oscillating system of LC type. The oscillating system is very important, as the performances of the circuit, for example the phase noise, quality coefficient, oscillation frequency, etc., depend on the design thereof. In a general manner, the output frequency F of the voltage controlled oscillator is a function of the inductance value of an inductor L of the oscillating system and of the total capacitance Ct of the oscillating system:

$$F=1/(2\pi\sqrt{L \times Ct(Uc)}).$$

In most cases, the total capacitance Ct and the oscillation frequency F vary in non-linear manner with the control voltage.

At present, two main techniques are used for design of voltage controlled oscillators having a linear capacitance/voltage characteristic.

A first technique consists in using a variable capacitor in a limited range of the control voltage Uc, in which the capacitance varies linearly. However, this means that the control voltage variation range has to be reduced. This technique enables a linear capacitance/voltage characteristic to be obtained but the gain of the oscillator is, in this case, very high and the phase noise is therefore great. In addition, as the voltage range is reduced, loop-locking of a phase lock loop is more difficult to perform and stability of the loop is difficult to achieve.

A second technique consists in differently biasing variable capacitors connected in parallel. This technique enables a linear capacitance/voltage characteristic to be obtained. However, this technique is difficult to perform.

U.S. Pat. No. 6,396,356 describes a voltage controlled oscillator 1 comprising several variable capacitors the linear parts of the capacitance/voltage characteristics whereof are used successively. As illustrated in FIG. 2, this oscillator 1 comprises an amplifier 5 and an oscillating system 6 of LC type comprising an inductor L. A first terminal 10 of the inductor L is connected to ground and a second terminal 11 of the inductor is connected to the output of the amplifier 5. The second terminal 11 of the inductor L is also connected to a feedback terminal 7 connected to a first input 8 of the amplifier 5. A second input 9 of the amplifier is connected to ground. The feedback terminal 7 is connected to ground on the one hand by means of a first assembly formed by a first variable capacitor Cv1 and a first fixed capacitance capacitor C1 connected in series, and on the other hand by means of a second assembly formed by a second variable capacitor Cv2 and a second fixed capacitance capacitor C2 connected in series. These two assemblies are thus arranged in parallel between the feedback terminal 7 and ground. The control voltage Uc can be applied to a terminal arranged between the first variable capacitor Cv1 and the first fixed capacitance capacitor C1, and/or to a terminal arranged between the second variable capacitor Cv2 and the second fixed capacitance capacitor C2. When switching from one variable capacitor to the other takes place, the control voltage Uc varies in discontinuous manner, which can cause pulling out of synchronism of a phase lock loop comprising this oscillator. Moreover, this oscillator presents a large difference between the minimum and maximum values of the total capacitance, and therefore presents a large phase noise.

The document U.S. Pat. No. 6,292,065 describes a voltage controlled oscillator comprising an oscillating module of LC type. The oscillating module comprises two inductors, a current source and two feedback transistors, which form a differential amplifier. The oscillating module comprises two input terminals. A set of first variable capacitors is connected, between the two input terminals, in parallel with a set of second variable capacitors. When a common mode voltage is applied to the input terminals, the capacitance of a pair of first variable capacitors increases and the capacitance of a pair of second variable capacitors decreases. This cancels the effect of the common mode voltage on an output frequency of the oscillating module. A voltage difference applied to the input terminals on the other hand enables the output frequency of the oscillating module to be modified.

The document U.S. Pat. No. 6,657,509 describes an oscillator of LC type. Two variable capacitors are each controlled by a potential difference applied between control terminals. The variable capacitors are, in addition, respectively connected to two output terminals. Each variable capacitor is formed by two MOS transistors themselves constituting variable capacitors. As in the document U.S. Pat. No. 6,292,065, a set of two transistors is thus connected between the output terminals, in parallel with a set formed by the other two transistors. The capacitance of the transistors increases with the control voltage.

OBJECT OF THE INVENTION

The object of the invention is to overcome these drawbacks and, more particularly, to achieve a voltage controlled oscillator having a linear and monotonic capacitance/voltage characteristic, enabling a continuous and monotonic gain to be obtained and the phase noise whereof is reduced.

According to the invention, this object is achieved by the accompanying claims and more particularly by the fact that the first and second variable capacitors are connected in series, the capacitance of one of the variable capacitors varying in the same direction as its control voltage and the capacitance of the other variable capacitor varying in the opposite direction to its control voltage.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
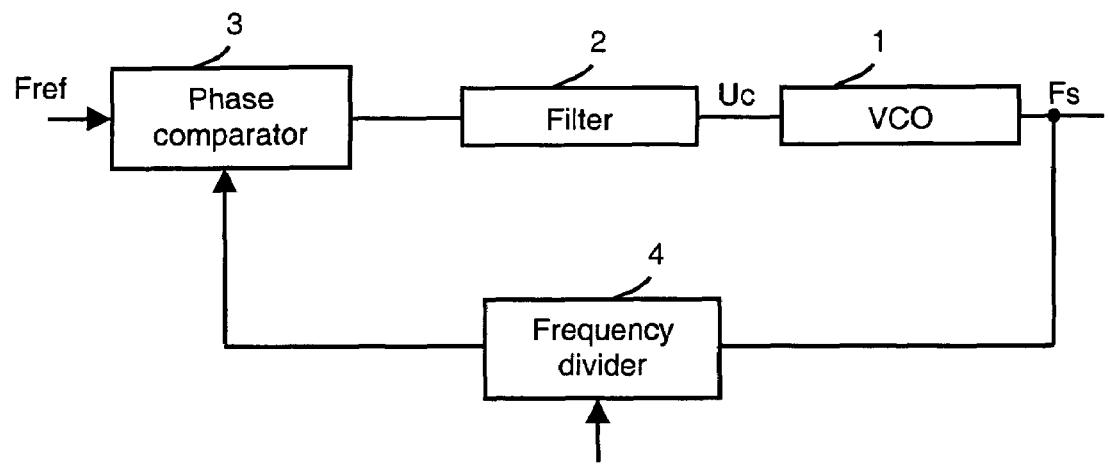
FIG. 1 schematically illustrates a phase lock loop of conventional type.
Figure 2:
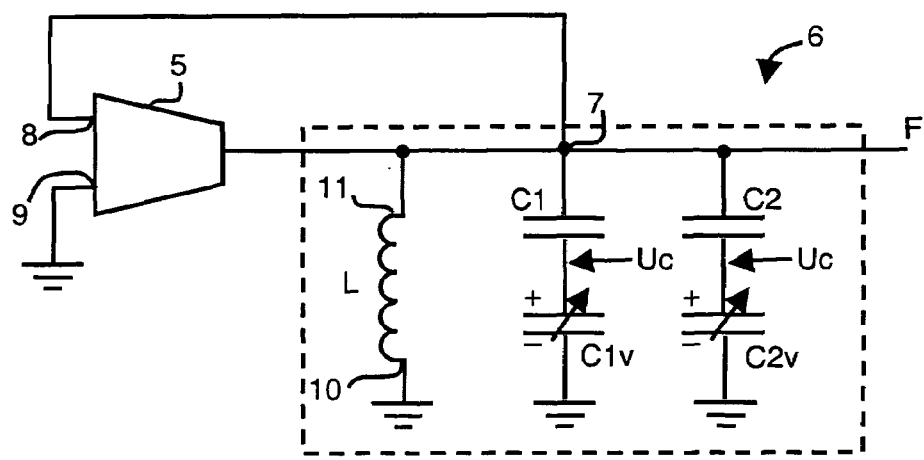
FIG. 2 illustrates a voltage controlled oscillator according to the prior art.
Figure 3:
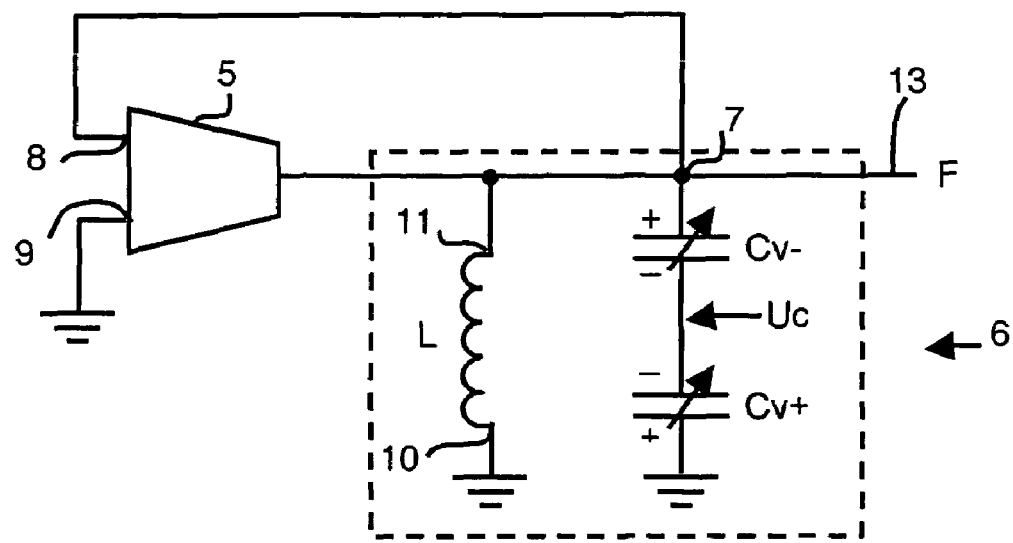
FIGS. 3 and 4 represent two particular embodiments of an oscillator according to the invention.

The voltage controlled oscillator 1 represented in FIG. 3 is an oscillator with a single output 13 which comprises an amplifier 5 and an oscillating system 6, of LC type, connected according to FIG. 2.

Thus, the first terminal 10 of the inductor L is grounded and the second terminal 11 of the inductor L is connected to the output of the amplifier 5. The second terminal 11 of the inductor L is also connected to the feedback terminal 7 connected to the first input 8 of the amplifier 5. The second input 9 of the amplifier is grounded.

The oscillating system 6 comprises a first variable capacitor Cv+ and a second variable capacitor Cv– connected in series between the feedback terminal 7 and ground. In the particular embodiment represented, the inductor L is thus connected in parallel with the first variable capacitor (Cv+) and the second variable capacitor (Cv–). A positive terminal of the first variable capacitor Cv+ is grounded and a positive terminal of the second variable capacitor Cv– is connected to the feedback terminal 7. In FIG. 3, the first and second variable capacitors Cv+ and Cv– are arranged in opposition.

In FIG. 3, a negative terminal of the first variable capacitor Cv+ is connected to a negative terminal of the second variable capacitor Cv–. The first variable capacitor Cv+ and the second variable capacitor Cv– thus comprise a common terminal connected to their respective negative terminals. The control voltage Uc of the oscillator 1 is applied to the terminal common to the variable capacitors Cv+ and Cv–.

The capacitance of the first variable capacitor Cv+ varies in the same direction as its control voltage, whereas the capacitance of the second variable capacitor Cv– varies in the opposite direction to its control voltage, i.e. the capacitance decreases when the control voltage of the second variable capacitor Cv– increases. The control voltage is defined in the conventional sense of control voltage of the type of variable capacitor used.

The control voltage Uv of a variable capacitor is in fact conventionally defined as the potential difference between a negative terminal and a positive terminal of the variable capacitor Cv, i.e. according to the equation Uv=(Uneg–Upos).

The variable capacitor is for example formed by a MOSFET transistor the source and drain whereof are connected. The negative terminal of the variable capacitor is thus formed by the connected drain and source and the positive terminal of the variable capacitor is formed by the transistor gate. The control voltage of a MOSFET is defined by the voltage Udg applied between the drain and gate, i.e. according to the equation Udg=Vd–Vg.

The variable capacitors Cv+ and Cv– can be formed by any suitable means and, more particularly, by varactors of diode type or of transistor type, or by MEMS-based capacitors. The variable capacitor Cv+ the capacitance whereof varies in the same direction as its control voltage can in particular be formed by a PMOS transistor. The variable capacitor Cv– the capacitance whereof varies in the opposite direction as its control voltage is for example formed by a NMOS transistor. NMOS transistors of N+/N/N+ type and PMOS transistors of P+/P/P+ type are preferably used.

Figure 4:
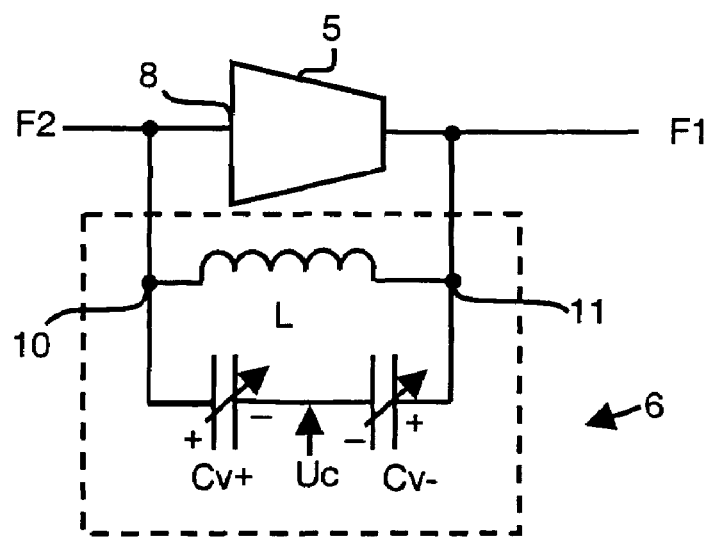

The voltage controlled oscillator 1 represented in FIG. 4 is an oscillator with a differential output and comprises, as previously, a first variable capacitor Cv+ and a second variable capacitor Cv– connected in series and in opposition. The assembly formed by the first and second variable capacitors Cv+ and Cv– is connected, in parallel with the inductor L, between the input 8 and the output of the amplifier 5. The amplifier 5 receives a signal having a frequency F2 on its input 8.

Figure 5:
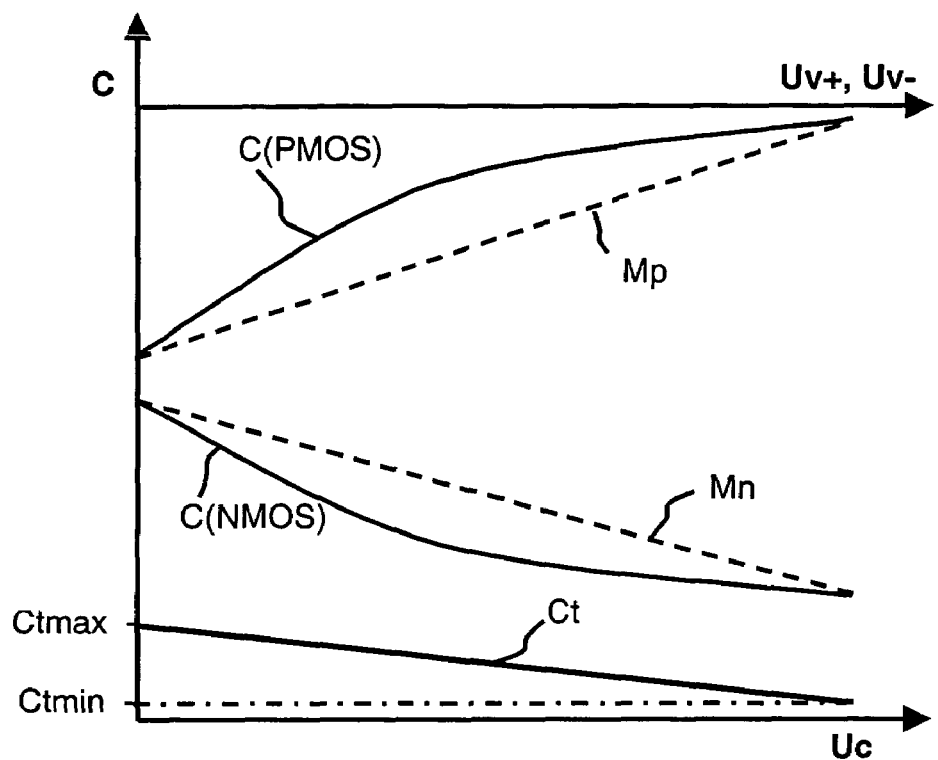
FIG. 5 illustrates the variations of the total capacitance of an oscillator according to FIG. 3 versus its control voltage Uc and the variations of the capacitance of each of the variable capacitors versus its control voltage.

FIG. 5 illustrates an example of the non-linear variations of the capacitance of each of the variable capacitors Cv+ and Cv–, respectively formed by PMOS and NMOS transistors, respectively versus their corresponding control voltages Uv+ and Uv– (horizontal axis at the top of FIG. 5).

The capacitance C(PMOS) of the PMOS capacitor increases when the voltage Uv+ applied to its terminals increases, in the conventional sense, whereas the capacitance C(NMOS) of the NMOS capacitor decreases when the voltage Uv– applied to its terminals increases.

FIG. 5 also illustrates, versus the control voltage Uc of the oscillator (horizontal axis at the bottom of FIG. 5), the variations of the total capacitance Ct, i.e. the capacitance/voltage characteristic, of the oscillating system 6 represented in FIG. 3. Serial connection of the first variable capacitor (Cv+) and the second variable capacitor (Cv–) enables substantially linear variations of the total capacitance Ct of the oscillating system 6 versus the control voltage Uc to be obtained. In addition, the slope of the curve representing the total capacitance Ct is smaller, in absolute value, to the mean slopes Mp and Mn of the curves respectively representing the capacitances C(PMOS) and C(NMOS) of the PMOS and NMOS capacitors. Thus, the difference between the minimum value Ctmin and the maximum value Ctmax of the total capacitance Ct is smaller than the difference between the extreme values of each of the capacitances C(PMOS) and C(NMOS), which enables a smaller gain K to be obtained, and the phase noise is thereby reduced.

The series of the variable capacitors Cv+ and Cv− then presents a linear and monotonic common capacitance/voltage characteristic without discontinuity.

Furthermore, this series does not require the biases of the capacitors to be changed or require switching from one capacitor to the other. The common capacitance/voltage characteristic has a constant slope over a range of the control voltage Uc, for example comprised between 0V and 1.2V, which is greater than the control voltage range of the prior art.

Figure 6:
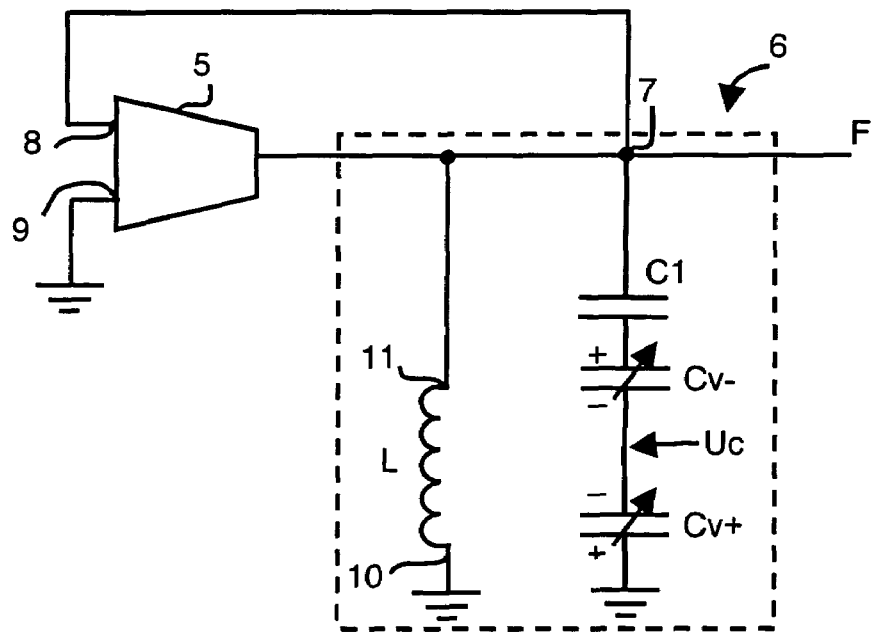
FIGS. 6 and 7 represent two particular embodiments of an oscillator according to the invention.

FIG. 6 represents a circuit according to FIG. 3 comprising in addition a capacitor C1 having a fixed capacitance and connected in series with the first and second variable capacitors Cv+ and Cv−, notably between the feedback terminal 7 on the one hand, and the assembly formed by the variable capacitors Cv+ and Cv− on the other hand. The fixed capacitance capacitor C1 can also be placed in parallel with the variable capacitors depending on whether the global capacitance is to be reduced or increased.

Figure 7:
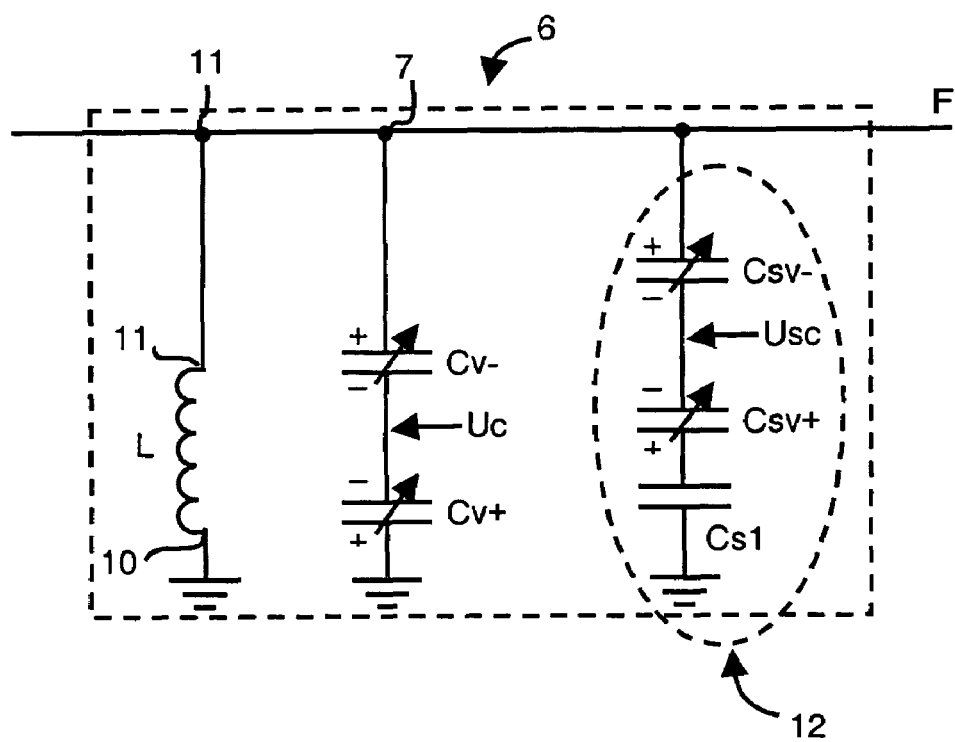

FIG. 7 represents a circuit according to FIG. 3 comprising in addition an additional series 12 connected between ground and the feedback terminal 7, in parallel with the series formed by the first variable capacitor (Cv+) and the second variable capacitor (Cv−). The additional series 12 comprises at least a first additional variable capacitor Csv+ and a second additional variable capacitor Csv− connected in opposition. An additional control voltage Usc is applied to the terminal common to the negative terminals of the first and second additional variable capacitors Csv+ and Csv−. The additional series 12 may comprise an additional fixed capacitance capacitor Cs1. The capacitance of the first additional variable capacitor Csv+ varies in the same direction as its control voltage and the capacitance of the second additional variable capacitor Csv− varies in the opposite direction to its control voltage. As previously, the additional fixed capacitance capacitor Cs1 can also be connected in parallel with the set of additional variable capacitors.

The invention is not limited to the particular embodiments represented. In particular, the positive terminals of the first and second variable capacitor can be connected to a common terminal (not shown), the control voltage of the oscillating system being, as previously, applied to the terminal common to the first and second variable capacitors.

Moreover, one or more fixed capacitance capacitors (C1, C2, Cs1, etc . . . ) can be connected between the first variable capacitor Cv+ on the one hand and the second variable capacitor Cv− on the other hand, or between the ground on the one hand and the set of variable capacitors Cv+ and Cv− on the other hand. Furthermore, an alternation of the first capacitor (Cv+) and the second capacitor (Cv−) can be connected in series, for example between ground and the terminal 7, possibly in combination with fixed capacitance capacitors.

In one embodiment, not represented, several additional series 12 are connected between the terminal 7 and ground, each series comprising at least a first additional variable capacitor (Csv+) and a second additional variable capacitor (Csv−) and, possibly, additional fixed or variable capacitances.

The invention claimed is:

1. Voltage controlled oscillator comprising an amplifier and an oscillating system, said oscillating system comprising an inductor having first and second terminals, the second terminal of the inductor being connected to an output of the amplifier, at least first and second variable capacitors in series being connected in parallel with said inductor between the first and second terminals of the inductor and having a common terminal constituting an input terminal for a control voltage, the capacitance of one of the variable capacitors varying in the same direction as the voltage applied thereto and the capacitance of the other variable capacitor varying in the opposite direction to the voltage applied thereto.

2. Oscillator according to claim 1, wherein the first and second variable capacitors are formed by transistors, respectively of PMOS and NMOS type.

3. Oscillator according to claim 1, wherein at least one capacitor having a fixed capacitance is connected in series or in parallel with the first and second variable capacitors.

4. Oscillator according to claim 1, wherein at least one additional series of additional first and second variable capacitors is connected in parallel with the first and second variable capacitors.

5. Oscillator according to claim 4, wherein at least one additional capacitor having a fixed capacitance is connected in series or in parallel with the additional first and second variable capacitors.

6. Oscillator according to claim 1, wherein the first and second variable capacitors are connected in opposition.

7. Oscillator according to claim 1, wherein the first terminal of the inductor is grounded, the output of the amplifier constituting a feedback terminal connected to a first input of the amplifier, a second input of the amplifier being grounded.

8. Oscillator according to claim 1, wherein the first terminal of the inductor is connected to an input of the amplifier.

9. Voltage controlled oscillator comprising an amplifier and an oscillating system comprising an inductor and at least first and second variable capacitors each having a capacitance varying according to its control voltage, wherein the first and second variable capacitors are formed by transistors, respectively of PMOS and NMOS type, and the first and second variable capacitors are connected in series, the capacitance of one of the variable capacitors varying in the same direction as its control voltage and the capacitance of the other variable capacitor varying in the opposite direction to its control voltage.

* * * * *